United States Patent
Lu et al.

(10) Patent No.: US 10,381,865 B2
(45) Date of Patent: Aug. 13, 2019

(54) UNINTERRUPTIBLE POWER SUPPLE DISPLAY DEVICE

(71) Applicant: VOLTRONIC POWER TECHNOLOGY CORP., Taipei (TW)

(72) Inventors: Yu-Cheng Lu, Taipei (TW); Sheng-Rong Liu, Guangdong (CN); Juor-Ming Hsieh, Taipei (TW)

(73) Assignee: VOLTRONIC POWER TECHNOLOGY CORP., Taipei (TW)

( * ) Notice: Subject to any disclaimer, the term of this patent is extended or adjusted under 35 U.S.C. 154(b) by 135 days.

(21) Appl. No.: 15/818,354

(22) Filed: Nov. 20, 2017

(65) Prior Publication Data

US 2019/0052121 A1  Feb. 14, 2019

(30) Foreign Application Priority Data

Aug. 14, 2017 (CN) .................... 2017 2 1014165 U (51) Int. Cl.
*H02J 9/00* (2006.01)
*H05K 5/00* (2006.01)
*G06F 3/14* (2006.01)

(52) U.S. Cl.
CPC .............. *H02J 9/00* (2013.01); *G06F 3/1423* (2013.01); *G06F 3/1454* (2013.01); *H05K 5/0017* (2013.01); *H05K 5/0021* (2013.01)

(58) Field of Classification Search
CPC ........ H02J 9/00; G06F 3/1423; G06F 3/1454; H05K 5/0017; H05K 5/0021
See application file for complete search history.

(56) References Cited

U.S. PATENT DOCUMENTS

2005/0162019 A1 * 7/2005 Masciarelli ............. H02J 9/062
307/66

* cited by examiner

*Primary Examiner* — Robert L Deberadinis
(74) *Attorney, Agent, or Firm* — Li & Cai Intellectual Property (USA) Office (57) ABSTRACT

The present invention provides an uninterruptible power supply display device which includes a signal bus and a plurality of power supply modules each having a power supply unit, a display unit and a control unit. The plurality of power supply modules electrically connect with the signal bus. The control unit on each power supply module simultaneously electrically connects with the power supply unit, the display unit and the signal bus. Each display unit can be operated under a single machine display mode or a system display mode. When under the single machine display mode, the display unit displays the operation message of the corresponding power supply module. When under the system display mode, the display unit generates a system display screen to display the operation messages of the plurality of power supply modules.

10 Claims, 8 Drawing Sheets

UNINTERRUPTIBLE POWER SUPPLE DISPLAY DEVICE

FIELD OF THE INVENTION

The present disclosure relates to an uninterruptible power supply (UPS) display device; more particularly, to a modularized, frame-based and UPS-based uninterruptible power supply display device.

DESCRIPTION OF RELATED ART

A great deal of computer and automation devices can be found in general networks, the data centers in telecommunication industries, mass rapid transit (MRT), high-speed rail (HSR), the control centers of public transportation infrastructure such as highway, hospitals, and the control centers of various industries. During the operation of these electronic devices, steady and uninterruptible power supply is essential to keep the operation regularly going on. However, the public power system is usually impacted by accidents such as open circuit to the transmission line and short circuit, which results in voltage drop or power interruption to power subscribers.

Currently-available UPSs on the market adopt modularized frame-bases structure. These UPSs are usually composed of multiple and mutually-independent power supply modules and battery modules and a control unit, and the power supply module, the battery module and the control are all installed on a machine shelf. Each of the power supply modules can be viewed as a micro-sized UPS. The power supply modules can be connected to become a modularized UPS as well.

In order to monitor the current, voltage, current frequency and the operation message when under operation of each of the power supply modules, each power supply module is usually equipped with a display screen to display the operation messages of each power supply module. Meanwhile, the modularized frame-bases UPSs are also equipped with another display screen to display system operation messages, for users to monitor the system messages of the entire UPS and the operation status of each of the power supply modules.

However, additional display screen should be installed to achieve monitoring, which takes up extra spaces in the machine shelf and further results in waste of space. What is even worse is that, if the display screen fails, users will not be able to monitor the UPS, which causes inconveniences, because maintenance should be underwent right away.

Accordingly, the current UPSs are of the problems as addressed above, thus how to improve the current UPSs to overcome the flaws becomes a critical issue to the industries.

SUMMARY OF THE INVENTION

In concerning the deficiencies as addressed above, an UPS display device that reduces the waste of space and increases the flexibility when using is provided in the present disclosure.

The UPS display device as provided in an embodiment of the present disclosure includes a signal bus, and a plurality of power supply modules, electrically connected with the signal bus, in which each of the plurality of power supply modules has a corresponding power supply unit, a display unit and a control unit, and the power supply unit that each of the plurality of power supply modules corresponds to transmits an operation message representing the power supply module to the signal bus. Each control unit electrically connects with the corresponding display unit and the corresponding power supply unit, and electrically connects with the signal bus. Each control unit controls the display unit to be operated under a single machine display mode or in a system display mode according to a control signal generated by a control interface. When the display unit is operated under the single machine display mode, the display unit captures the operation message of the corresponding power supply module, so as to generate a single machine display image to display the operation message. When the display unit is operated under the system display mode, the display unit captures the operation message of the corresponding power supply module, and controls the display unit to generate a system display screen to display the operation messages of the plurality of power supply modules.

In a preferred embodiment, the control unit of each of the plurality of power supply modules connects with the corresponding power supply unit through a first connection port, and connects the signal through a second connection port.

In a preferred embodiment, the first connection port is a serial communication interface connection port, and the second connection port and the signal bus are respectively a control message local area network bus.

The UPS display device as provided in another embodiment of the present disclosure includes a signal bus, and a machine case having an accommodation room, and a plurality of power supply modules and a plurality of battery modules being disposed in the accommodation case. The plurality of power supply modules electrically connect with the signal bus, each of the plurality of power supply modules has a corresponding power supply unit, a. display unit and a control unit, and the power supply unit that each of the plurality of power supply modules corresponds to transmits an operation message representing the power supply module to the signal bus. Each control unit electrically connects with the corresponding display unit and the corresponding power supply unit, and electrically connects with the signal bus. Each control unit controls the display unit to be operated under a single machine display mode or in a system display mode according to a control signal generated by a control interface. When the display unit is operated under the single machine display mode, the display unit captures the operation message of the corresponding power supply module, so as to generate a single machine display image to display the operation message. When the display is operated under the system display mode, the display unit captures the operation message of the corresponding power supply module, and controls the display unit to generate a system display screen to display the operation messages of the plurality of power supply modules.

In a preferred embodiment, the control unit of each of the plurality of power supply modules connects with the corresponding power supply unit through a first connection port, and connects the signal through a second connection port, the first connection port is a serial communication interface connection port, and the second connection port and the signal bus are respectively a control message local area network bus.

In a preferred embodiment, the plurality of power supply modules and the plurality of battery modules are swappably disposed in the accommodation room, and a connector module is disposed at a position where the accommodation room of the machine case corresponds to each of the power supply modules. When the plurality of power supply modules are installed in the accommodation room, the plurality of power supply modules respectively electrically connect with the connector module, and electrically connect with the signal bus through the connector module.

In a preferred embodiment, the plurality of connector modules respectively have at least one connector, and at least one connection element is disposed at the position where each of the power supply modules corresponds to the at least one connector. The at least one connector and the at least one connection element respectively have a plurality communication pins, and each of the power supply modules electrically connects with the signal bus through the plurality of communication pins.

In a preferred embodiment, the plurality of power supply modules each have an outer case and a plurality installment frames, the display is disposed in front of the outer case, the power supply unit is disposed inside the outer case, the at least one connection element is disposed at the rear side of the outer case, the plurality of power supply modules are respectively installed inside the machine case through the installment frames, and the plurality of connector modules are respectively installed on the installment frame.

In a preferred embodiment, the operation message of each of the plurality of power supply modules includes input and output currents, voltage and current frequency of each of the plurality of power supply modules, and the operation message further includes an identification code representing the power supply module the power supply unit corresponds to.

For the further understanding of the present disclosure, the following embodiments are provided along with illustrations to facilitate the disclosure of the present disclosure.

DETAILED DESCRIPTION OF THE PREFERRED EMBODIMENTS

The aforementioned illustrations and following detailed description are exemplary for the purpose of further explaining the scope of the present disclosure. Other objectives and advantages related to the present disclosure will be illustrated in the following description and appended drawings.

Figure 1:
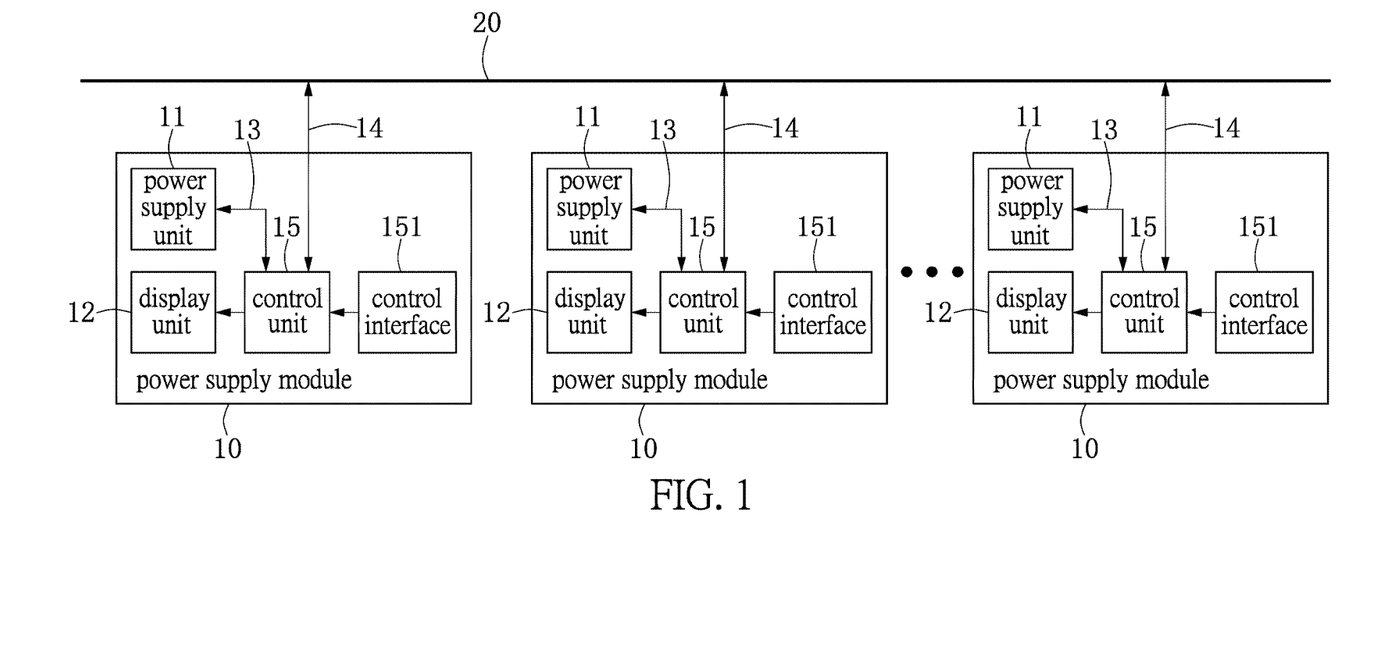
FIG. 1 is a schematic view illustrating the system block of the UPS display device according to the present disclosure.
Figure 2:
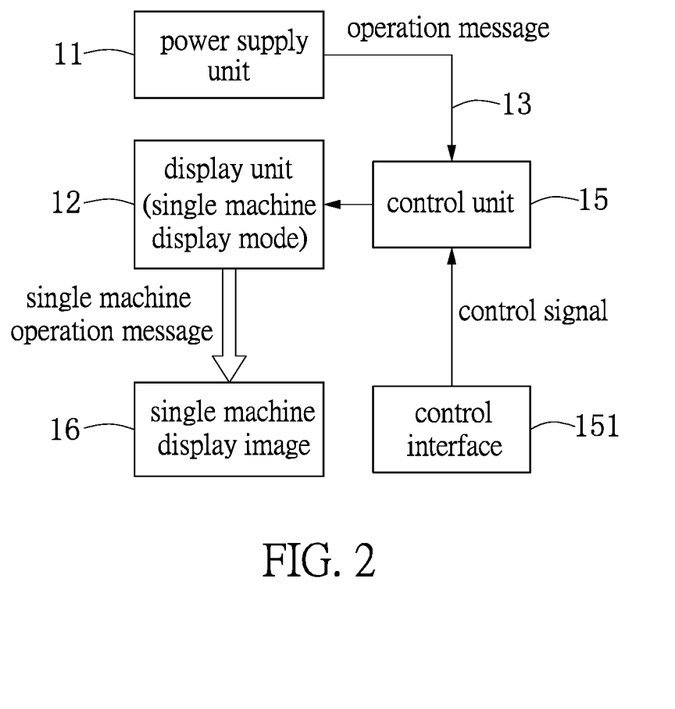
FIG. 2 is a schematic view illustrating the operational flowchart when the UPS display device according to the present disclosure is operated under single machine display mode.
Figure 3:
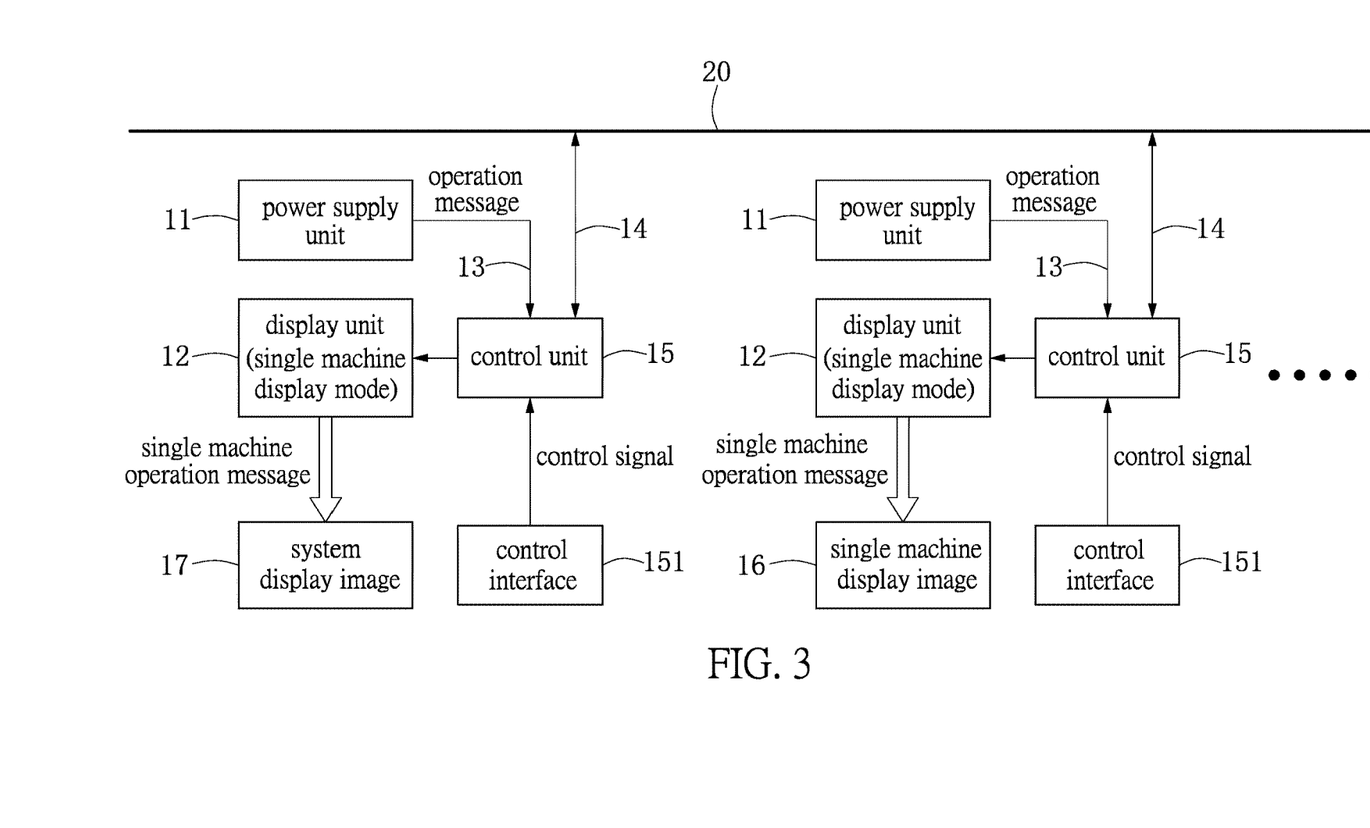
FIG. 3 is a schematic view illustrating the operational flowchart when the UPS display device according to the present disclosure is operated under system display mode.

Reference is made to FIGS. 1-3. A display device used in a modularized UPS is provided in the present disclosure, which includes a signal bus 20 and a plurality of power supply modules 10. Each of the plurality of power supply modules 20 connects with the signal bus 20. Each of the plurality of power supply modules 20 can serve as an independent UPS, or, by connecting each of the plurality of power supply modules 20 to become a modularized UPS. Each of the plurality of power supply modules 20 includes a power supply unit 11, a display unit and a control unit 13. The control unit 15 electrically connects with the display unit 12, electrically connects with the corresponding power supply unit 11 through the first connection port 13, and electrically connects with the signal bus 20 through a second connection port 14.

The power supply unit 11 of each of the plurality of power supply modules 20 has a voltage regulator, a current transformer, an AC/DC converter, and circuit component such as a detection circuit and a controller. When the power supply module 10 is in operation, each power supply unit 11 can generate an operation message representing the power supply module 10, and by the first connection port 13, the operation message is transmitted to the control unit 15. The operation message outputted by each power supply unit 11 includes the basic information such as the input/output current, voltage, temperature and current frequency of the power supply module 10, and information such as the operational status or malfunction message of the power supply module 10 in order for an operator to monitor the status of the power supply module 10. In addition, the operation message can further include an identification code representing the power supply module 10 the power supply unit 11 corresponds to, in order to identify the power supply module 10 represented by the operation message.

Each of the control units 15 connects with a control interface 151. Users can input a control signal over the control interface 151, and the control 15, according to the control signal, controls the display unit 12 to switch to a single machine display mode or a system display mode to operate. The control interface 151 may be a physical control switch, or a software-based control interface. When the display unit 12 switches to operate under single machine display mode, the control unit 15 controls the display unit 12 to display a single machine display image, for displaying the operation message outputted by the power supply unit 11 the display unit 12 corresponds to, so as to allow users to observe the operation message of the plurality of power supply modules 10 over the display image of the system.

In one embodiment of the present disclosure, the first connection port 13 can be a serial communication interface (SCI) connection port, and serve as the communication interface between the control unit 15 and the corresponding power supply unit 11. The signal bus 20 and the second connection port 14 can respectively be a communication interface of controller area network (CANbus) spec, so as to serve as the communication interface between each of the power supply modules 10 and each of the control units 15.

One of the features of the UPS display device of the present disclosure is that the display unit 12 of each of the power supply modules can, according to the control of the control unit 15, set to operate under a single machine mode or a system mode. Reference is next made to FIG. 2. When the display unit 12 is switched to the single machine mode, the control unit 15 can, via the first connection port 13, capture the operation message outputted by the corresponding power supply unit 11, and control the corresponding display unit 12 to output a single machine display image 16.

By the single machine display image 16, the operation message outputted by the corresponding power supply unit 11 can be displayed, so as to allow users to monitor the operational status of the power supply module 10 via the display unit 12.

Reference is next made to FIG. 3. When the display unit 12 is operated under the system display mode, the control unit 15 captures the operation messages outputted by the power supply unit 11 of the plurality of power supply modules 10 from the signal bus 20, and combines the operation messages as a system message. The corresponding display unit 12 is then controlled to output a system display image 17, and the system message is displayed by the system display image 17. When the display unit 12 is operated under the system display mode, the operation messages from different power supply modules 10 can be gathered, and can be displayed by the display unit 12. Therefore, users can monitor the operational status of each power supply module 10 from a single display unit 12.

Figure 4:
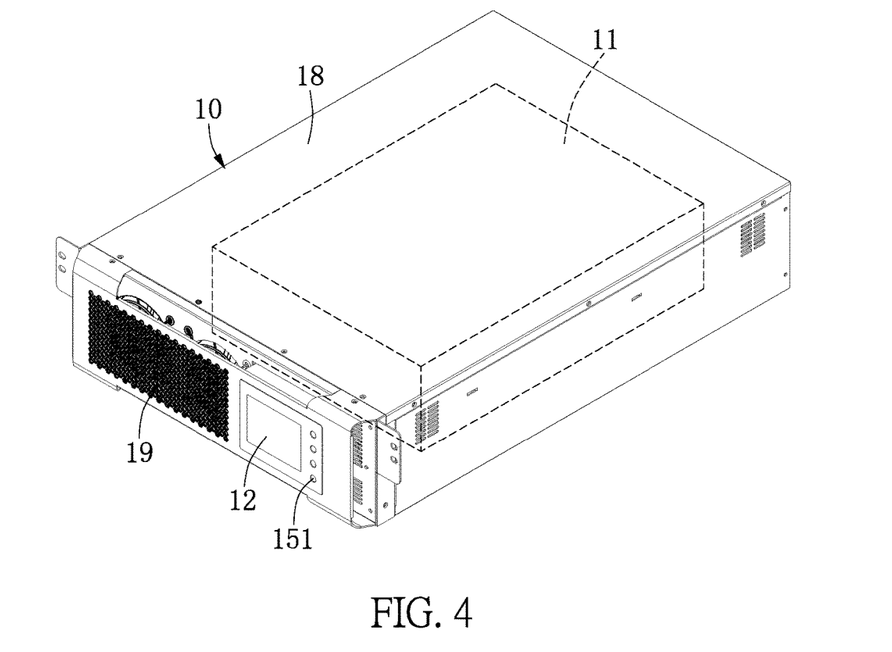
FIG. 4 is a 3D schematic view illustrating the power supply module adopted by a modularized UPS.
Figure 5:
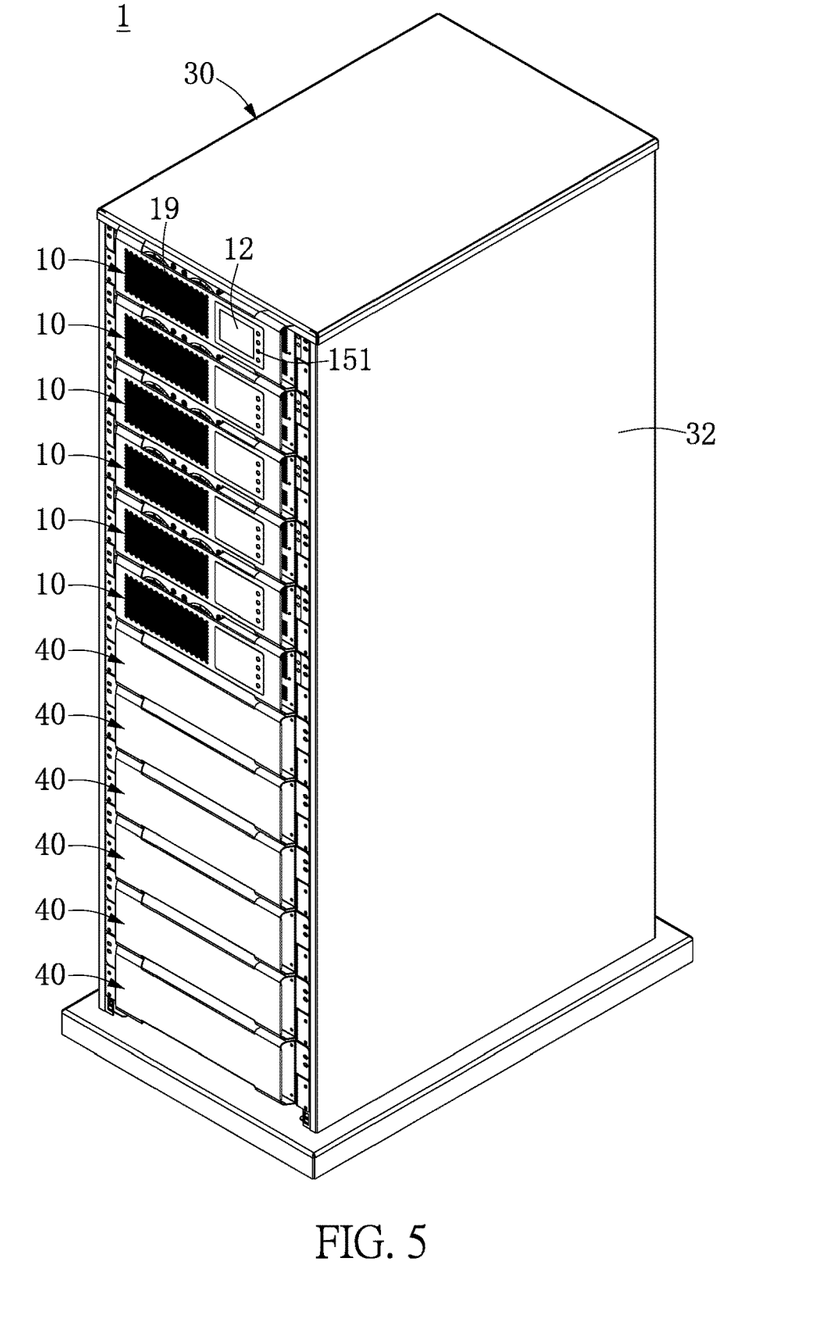
FIG. 5 is a 3D assembly view illustrating a modularized UPS adopting the technique of the present disclosure.
Figure 6:
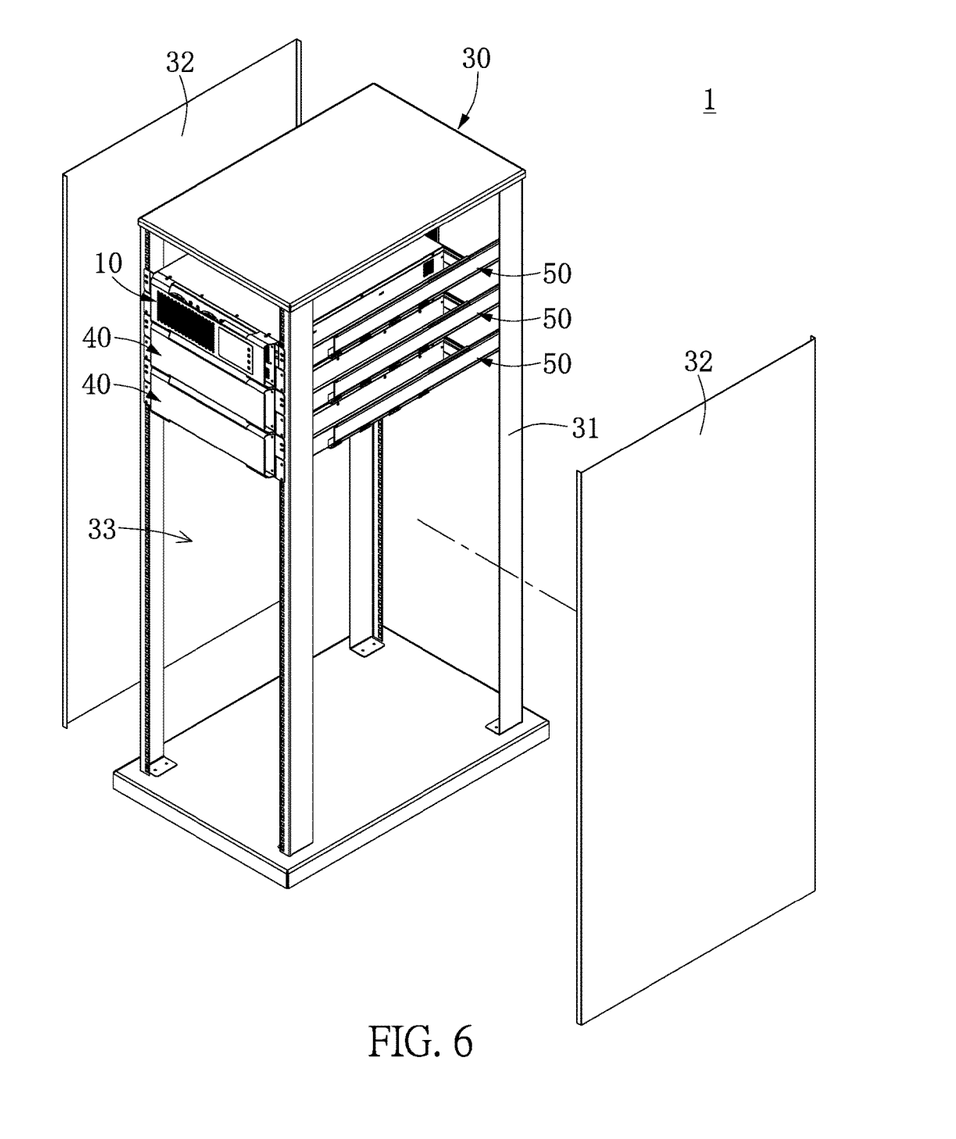
FIG. 6 is a exploded view illustrating a modularized UPS adopting the technique of the present disclosure.

Reference is made to FIGS. 4-6, in which a modularized UPS 1 adopting the techniques as provided in the present disclosure is illustrated. The modularized. UPS 1 includes a plurality of power supply modules 10, a plurality of battery modules 40, a plurality of installment frames 50 and a machine case 30. The plurality of power supply modules 10 and the a plurality of battery modules 40 are designed to be independent modules, the power supply module 10 and the battery module 40 are of the same size, and can be disposed on the plurality of installment frames 50. The UPS 1 is formed by, disposing the power supply module 10 and the battery module 40 on the machine case 30 through the installment frames 50.

Figure 8:
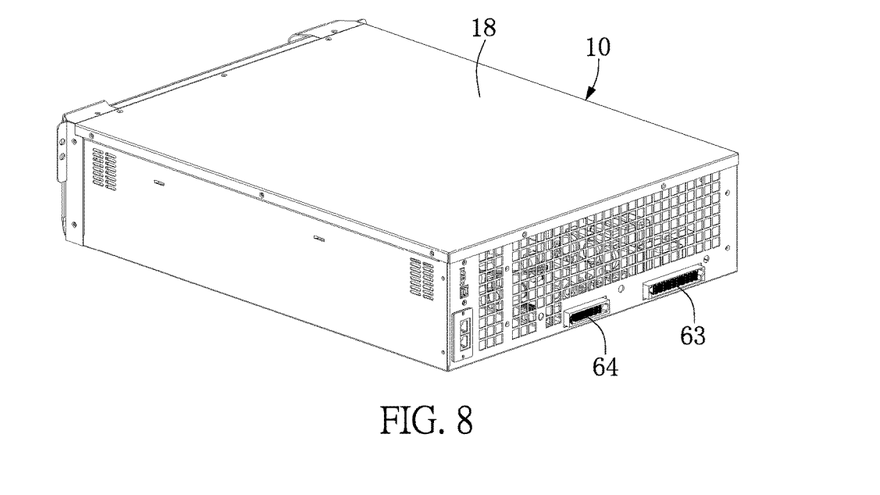
FIG. 8 is a 3D view taken from the rear side illustrating the power supply module adopted by the present disclosure.

As shown in FIGS. 4 and 8, the power supply module 10 has an outer shell 18, and the power supply unit 11 is disposed inside the outer shell 18 of the power supply module 10. At the front side of the outer shell 18, the display unit 18 is disposed, and a vent 19 is further disposed for dissipating the heat. In the present embodiment, the display unit 12 has a display panel, and a control interface 15 implemented in a physical button is disposed on one lateral side of the display unit 12, so as to allow users to set up and operate the display unit 12.

Figure 7:
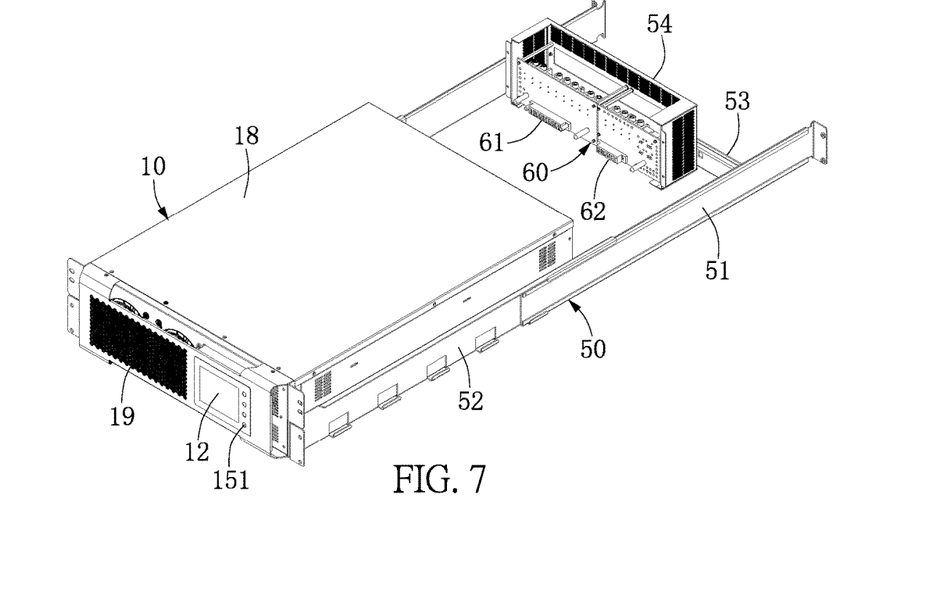
FIG. 7 is a 3D view illustrating the power supply module and an installment frame adopted by the present disclosure.

Reference is made to FIGS. 6 and 7. In the present embodiment, the machine case 30 has a plurality of frame bodies 31 and two lateral plates 32. An accommodation room 33 is formed between the two lateral plates 32. The plurality of power supply modules 10 and the plurality of battery modules 40 are detachably disposed in the accommodation room 33 of the machine case 30 by the installment frames 50.

Figure 9:
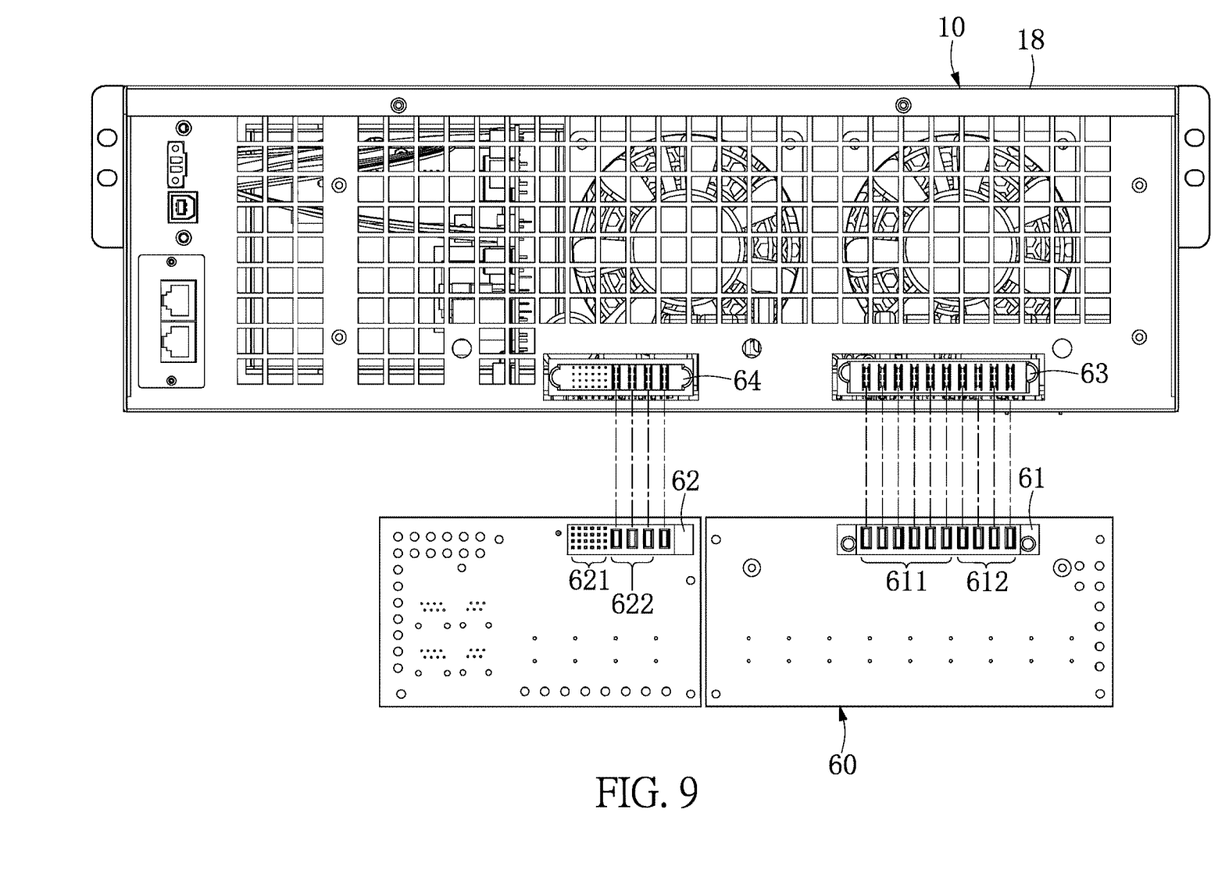
FIG. 9 is a schematic view illustrating the first and second connectors of the connector module and the pin definition of the first and second connection elements of the power supply module.

As shown in FIG. 7, in the present embodiment, each installment frame 50 includes two slide rail members 51 and two sliding members 52. The two sliding members 52 are disposed at the two lateral sides of the power supply module 10 or at the two lateral sides of the battery module 40, and the power supply module 10 or the battery module 40 is slidably disposed on the slide rail members 51 through the sliding members 52. Each of the installment frames 50 further includes a connection rod 53 connecting between the two slide rail members 51, and close to the rear side of the power supply module 10 or close to the rear side of the battery module 40. A fastening seat 54 is disposed on the connection rod 53, and a connector module 60 is disposed on the fastening seat 54. As shown in FIGS. 7-9, each of the connector modules 60 has a first connector 61 and a second connector 62, and a first connection element 63 and a second connection element 64 are respectively disposed at the position where the back of the outer shell 18 of each of the power supply modules 10 corresponds to the first and second connectors 61 and 62. When the power supply module 10 is disposed on the installment frame 50, the first connection element 63 and the second connection element 64 can electrically connect with the first connector 61 and the second connector 62 of the power supply module 60.

As shown in FIG. 9, in the present embodiment, the pin arrangement of the first and second connectors 61 and 62, and the first and second connection elements 63 and 64, are illustrated. The first connector 61 and the first connection element 63 respectively have a plurality of AC input pins 611 and a plurality of AC output pins 612. The second connector 62 and the second connection element 64 respectively have a plurality of DC input pins 622 and a plurality of communication pins 621. The plurality of communication pins 621 are connection pins complying with controller area network spec. The power supply unit 11 of the power supply module 10 and the second connection port 14 of the display unit 12 respectively electrically connect with the plurality of communication pins 621, and electrically connect with the signal bus 20 (not shown in the figure) through the communication pins 621.

As shown in FIG. 5, when the modularized UPS 1 is assembled, the plurality of power supply modules 10 are vertically arranged on the machine case 30, and each of the power supply modules 10 has a display unit 12 thereon. Therefore, users' inspection on the operational status of the UPS can be done by the operation message of each of the power supply modules 10 displayed by the display unit 12 of each of the power supply modules 10, or by switching any of the display unit 12 of the power supply module 10 to the system display mode, so as to display the operational status of other power supply modules 10 over the display unit 12.

One of the effects of the present disclosure is that, simplified structure for the modularized UPS 1 without extra displays for displaying system messages can be achieved, which decreases the volume of the UPS. Moreover, in the modularized UPS 1 of the present disclosure, each of the power supply modules 10 has a display unit 12. Each of the display units 12 can be set as either a single display mode or a system display mode, and that is, even if one of the display units 12 of the power supply modules 10 fails, users can switch other display units 12 of other power supply modules 10 to replace the failed display unit 12, thus increasing the flexibility of the UPS when using.

The description illustrated supra set forth simply the preferred embodiments of the present disclosure; however, the characteristics of the present disclosure are by no means restricted thereto. All changes, alterations, or modifications conveniently considered by those skilled in the art are deemed to be encompassed within the scope of the present disclosure delineated by the following claims.

What is claimed is:

1. A uninterruptible power supply display device, comprising:
   a signal bus; and
   a plurality of power supply modules, electrically connected with the signal bus, wherein each of the plurality of power supply modules has a corresponding power supply unit, a display unit and a control unit, and the power supply unit that each of the plurality of power supply modules corresponds to transmits an operation message representing the power supply module to the signal bus;

wherein each control unit electrically connects with the corresponding display unit and the corresponding power supply unit, and electrically connects with the signal bus;

wherein each control unit controls the display unit to be operated under a single machine display mode or in a system display mode according to a control signal generated by a control interface;

wherein when the display unit is operated under the single machine display mode, the display unit captures the operation message of the corresponding power supply module, so as to generate a single machine display image to display the operation message;

wherein when the display unit is operated under the system display mode, the display unit captures the operation message of the corresponding power supply module, and controls the display unit to generate a system display screen to display the operation messages of the plurality of power supply modules.

2. The uninterruptible power supply display device according to claim wherein the control unit of each of the plurality of power supply modules connects with the corresponding power supply unit through a first connection port, and connects the signal through a second connection port.

3. The uninterruptible power supply display device according to claim 2, wherein the first connection port is a serial communication interface connection port, and the second connection port and the signal bus are respectively a control message local area network bus.

4. The uninterruptible power supply display device according to claim I, wherein the operation message of each of the plurality of power supply modules includes input and output currents, voltage and current frequency of each of the plurality of power supply modules, and the operation message further includes an identification code representing the power supply module the power supply unit corresponds to.

5. An uninterruptible power supply display device, comprising:

a signal bus; and a machine case having an accommodation room, and a plurality of power supply modules and a plurality of battery modules being disposed in the accommodation case;

wherein the plurality of power supply modules electrically connect with the signal bus, each of the plurality of power supply modules has a corresponding power supply unit, a display unit and a control unit, and the power supply unit that each of the plurality of power supply modules corresponds to transmits an operation message representing the power supply module to the signal bus;

wherein each control unit electrically connects with the corresponding display unit and the corresponding power supply unit, and electrically connects with the signal bus;

wherein each control unit controls the display unit to be operated under a single machine display mode or in a system display mode according to a control signal generated by a control interface;

wherein when the display unit is operated under the single machine display mode, the display unit captures the operation message of the corresponding power supply module, so as to generate a single machine display image to display the operation message;

wherein when the display unit is operated under the system display mode, the display unit captures the operation message of the corresponding power supply module, and controls the display unit to generate a system display screen to display the operation messages of the plurality of power supply modules.

6. The uninterruptible power supply display device according to claim 5, wherein the control unit of each of the plurality of power supply modules connects with the corresponding power supply unit through a first connection port, and connects the signal through a second connection port;

wherein the first connection port is a serial communication interface connection port, and the second connection port and the signal bus are respectively a control message local area network bus.

7. The uninterruptible power supply display device according to claim 6, wherein the plurality of power supply modules and the plurality of battery modules are detachably disposed in the accommodation room, and a connector module is disposed at a position where the accommodation room of the machine case corresponds to each of the power supply modules, when the plurality of power supply modules are installed in the accommodation room, the plurality of power supply modules respectively electrically connect with the connector module, and electrically connect with the signal bus through the connector module.

8. The uninterruptible power supply display device according to claim 7, wherein the plurality of connector modules respectively have at least one connector, and at least one connection element is disposed at the position where each of the power supply modules corresponds to the at least one connector; the at least one connector and the at least one connection element respectively have a plurality communication pins, and each of the power supply modules electrically connects with the signal bus through the plurality of communication pins.

9. The uninterruptible power supply display device according to claim 5, wherein the plurality of power supply modules each have an outer case and a plurality installment frames, the display is disposed in front of the outer case, the power supply unit is disposed inside the outer case, the at least one connection element is disposed at the rear side of the outer case, the plurality of power supply modules are respectively installed inside the machine case through the installment frames, and the plurality of connector modules are respectively installed on the installment frame.

10. The uninterruptible power supply display device according to claim 5, wherein the operation message of each of the plurality of power supply modules includes input and output currents, voltage and current frequency of each of the plurality of power supply modules, and the operation message further includes an identification code representing the power supply module the power supply unit corresponds to.

* * * * *